United States Patent
Nehl et al.

(10) Patent No.: US 10,190,526 B2
(45) Date of Patent: Jan. 29, 2019

(54) ALTERNATING CURRENT DRIVE FOR ACTUATORS

(71) Applicant: GM GLOBAL TECHNOLOGY OPERATIONS LLC, Detroit, MI (US)

(72) Inventors: Thomas W. Nehl, Shelby Township, MI (US); Suresh Gopalakrishnan, Troy, MI (US); Avoki M. Omekanda, Rochester, MI (US); Chandra S. Namuduri, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/127,014

(22) PCT Filed: Mar. 19, 2015

(86) PCT No.: PCT/US2015/021398
§ 371 (c)(1),
(2) Date: Sep. 17, 2016

(87) PCT Pub. No.: WO2015/143116
PCT Pub. Date: Sep. 24, 2015

(65) Prior Publication Data
US 2017/0204805 A1 Jul. 20, 2017

Related U.S. Application Data

(60) Provisional application No. 61/968,127, filed on Mar. 20, 2014, provisional application No. 61/968,098, filed on Mar. 20, 2014.

(51) Int. Cl.
*F02D 41/40* (2006.01)
*F02D 41/20* (2006.01)
(Continued)

(52) U.S. Cl.
CPC ........ *F02D 41/402* (2013.01); *F02D 41/20* (2013.01); *F02M 51/061* (2013.01);
(Continued)

(58) Field of Classification Search
CPC .............. F02D 41/402; F02D 41/20; F02D 2041/2034; F02D 2041/2055; F02M 51/061; H01F 7/1607; H01F 7/18
(Continued)

(56) References Cited

U.S. PATENT DOCUMENTS 5,381,297 A 1/1995 Weber
5,831,809 A 11/1998 Schmitz
(Continued)

FOREIGN PATENT DOCUMENTS

DE 34 37 053 C2 6/1985
DE 196 43 788 A1 5/1998
(Continued)

OTHER PUBLICATIONS

A. M. Pawlak, Transient Finite Element Modeling of Solenoid Actuators, IEEE Transactions on Magnetics, Jan. 1988, 270-273, vol. 24, No. 1.
(Continued)

*Primary Examiner* — Mahmoud Gimie

(57) ABSTRACT

A method for providing consistent actuator events for each of a plurality of consecutive actuator events of an electromagnetic actuator, includes applying a first bi-directional current waveform for a first actuator event and applying a second bi-directional current waveform for a second actuator event immediately subsequent to the first actuator event. The first bi-directional current waveform includes applying current in a first direction when the actuator is commanded to an actuated position and applying current in a reversed second direction when the actuator is commanded to a rest (Continued)

position. The second bi-directional current waveform includes applying current in the reversed second direction when the actuator is commanded to an actuated position and applying current in the first direction when the actuator is commanded to a rest position.

20 Claims, 5 Drawing Sheets

(51) Int. Cl.
    *H03K 17/64*     (2006.01)
    *F02M 51/06*     (2006.01)
    *F02M 57/00*     (2006.01)
    *F16K 31/06*     (2006.01)
    *H02P 25/06*     (2016.01)
    *H01F 7/16*     (2006.01)
    *H01F 7/18*     (2006.01)

(52) U.S. Cl.
    CPC ...... *F02M 51/0671* (2013.01); *F02M 57/005* (2013.01); *F16K 31/0675* (2013.01); *H01F 7/1607* (2013.01); *H01F 7/18* (2013.01); *H02P 25/06* (2013.01); *H03K 17/64* (2013.01); *F02D 2041/2034* (2013.01); *F02D 2041/2044* (2013.01); *F02D 2041/2055* (2013.01); *F02D 2041/2058* (2013.01); *F02M 2200/24* (2013.01); *F02M 2200/247* (2013.01)

(58) Field of Classification Search
    USPC .................................. 123/490, 299, 300, 304
    See application file for complete search history.

(56) References Cited

U.S. PATENT DOCUMENTS

| | | |
|---|---|---|
| 6,168,135 B1 | 1/2001 | Fochtman |
| 6,321,700 B1 | 11/2001 | Hein |
| 2002/0148442 A1 | 10/2002 | Fraenkle |
| 2003/0184946 A1 | 10/2003 | Kolmanovsky |
| 2004/0057189 A1* | 3/2004 | Cheever, Jr. ........ F02D 41/2096 361/160 |
| 2007/0056784 A1 | 3/2007 | Joe |
| 2007/0120332 A1 | 5/2007 | Bushko |
| 2007/0285195 A1 | 12/2007 | Nehl |
| 2008/0204178 A1 | 8/2008 | Maranville |
| 2010/0018503 A1 | 1/2010 | Perry |
| 2011/0125391 A1 | 5/2011 | McAlister |
| 2012/0018262 A1 | 1/2012 | Winkler |
| 2012/0101707 A1 | 4/2012 | Kemmer |
| 2012/0239278 A1 | 9/2012 | Becker |
| 2012/0247428 A1 | 10/2012 | Grimminger |
| 2012/0316755 A1* | 12/2012 | Ibrahim ............... F02M 47/027 701/103 |
| 2013/0113407 A1 | 5/2013 | Neelakantan |
| 2013/0133748 A1 | 5/2013 | Lehner |
| 2014/0034025 A1* | 2/2014 | Nishimura ............ F02M 69/04 123/478 |
| 2014/0069533 A1 | 3/2014 | Gorzen |
| 2014/0092516 A1 | 4/2014 | Koch |
| 2014/0110508 A1 | 4/2014 | Dames |
| 2015/0123662 A1 | 5/2015 | Yasui |
| 2015/0267660 A1 | 9/2015 | Nehl |
| 2015/0267661 A1 | 9/2015 | Namuduri |
| 2015/0267662 A1 | 9/2015 | Nehl |
| 2015/0267663 A1 | 9/2015 | Namuduri |
| 2015/0267666 A1 | 9/2015 | Gopalakrishnan |
| 2015/0267667 A1 | 9/2015 | Namuduri |
| 2015/0267668 A1 | 9/2015 | Gopalakrishnan |
| 2015/0267669 A1 | 9/2015 | Nehl |
| 2015/0267670 A1 | 9/2015 | Nehl |
| 2015/0285175 A1 | 10/2015 | Parrish |

FOREIGN PATENT DOCUMENTS

| | | |
|---|---|---|
| DE | 199 21 938 A1 | 12/1999 |
| DE | 10 2007 053 877 B3 | 4/2009 |
| DE | 10 2011 083 007 A1 | 3/2013 |
| DE | 10 2012 208 781 B4 | 11/2013 |
| EP | 0 074 420 A1 | 3/1983 |
| EP | 1670005 A2 | 6/2006 |
| EP | 2336544 A1 | 6/2011 |
| JP | 10-311265 A | 11/1998 |
| JP | 2007-270658 A | 10/2007 |
| KR | 10-2002-0094494 A | 12/2002 |
| WO | WO 90-02872 A1 | 3/1990 |
| WO | WO 87-01765 A1 | 3/1997 |
| WO | WO 2015 143107 A1 | 9/2015 |
| WO | WO 2015 143109 A1 | 9/2015 |
| WO | WO 2015 143116 A1 | 9/2015 |

OTHER PUBLICATIONS

T. W. Nehl, ANTIC85: A General Purpose Finite Element Package for Computer Aided Design, IEEE Transactions on Magnetics, Jan. 1988, 358-361, vol. 24, No. 1.

* cited by examiner

ALTERNATING CURRENT DRIVE FOR ACTUATORS

TECHNICAL FIELD

This disclosure is related to solenoid-activated actuators.

BACKGROUND

Solenoid actuators can be used to control fluids (liquids and gases), or for positioning or for control functions. A typical example of a solenoid actuator is the fuel injector. Fuel injectors are used to inject pressurized fuel into a manifold, an intake port, or directly into a combustion chamber of internal combustion engines. Known fuel injectors include electromagnetically-activated solenoid devices that overcome mechanical springs to open a valve located at a tip of the injector to permit fuel flow therethrough. Injector driver circuits control flow of electric current to the electromagnetically-activated solenoid devices to open and close the injectors. Injector driver circuits may operate in a peak-and-hold control configuration or a saturated switch configuration.

Fuel injectors are calibrated, with a calibration including an injector activation signal including an injector open-time, or injection duration, and a corresponding metered or delivered injected fuel mass operating at a predetermined or known fuel pressure. Injector operation may be characterized in terms of injected fuel mass per fuel injection event in relation to injection duration. Injector characterization includes metered fuel flow over a range between high flow rate associated with high-speed, high-load engine operation and low flow rate associated with engine idle conditions.

It is known for engine control to benefit from injecting a plurality of small injected fuel masses in rapid succession. Generally, when a dwell time between consecutive injection events is less than a dwell time threshold, injected fuel masses of subsequent fuel injection events often result in a larger delivered magnitude than what is desired even through equal injection durations are utilized. Accordingly, such subsequent fuel injection events can become unstable resulting in unacceptable repeatability. This undesirable occurrence is attributed to the existence of residual magnetic flux within the fuel injector that is produced by the preceding fuel injection event that offers some assistance to the immediately subsequent fuel injection event. The residual magnetic flux is produced in response to persistent eddy currents and magnetic hysteresis within the fuel injector as a result of shifting injected fuel mass rates that require different initial magnetic flux values.

SUMMARY

A method for providing consistent actuator events for each of a plurality of consecutive actuator events of an electromagnetic actuator, includes applying a first bi-directional current waveform for a first actuator event and applying a second bi-directional current waveform for a second actuator event immediately subsequent to the first actuator event. The first bi-directional current waveform includes applying current in a first direction when the actuator is commanded to an actuated position and applying current in a reversed second direction when the actuator is commanded to a rest position. The second bi-directional current waveform includes applying current in the reversed second direction when the actuator is commanded to an actuated position and applying current in the first direction when the actuator is commanded to a rest position.

BRIEF DESCRIPTION OF THE DRAWINGS

One or more embodiments will now be described, by way of example, with reference to the accompanying drawings, in which:

FIG. 1-2 illustrates a schematic sectional view of the activation controller of FIG. 1, in accordance of the present disclosure;

FIG. 1-3 illustrates a schematic sectional view of an injector driver of FIGS. 1-1 and 1-2, in accordance to the present disclosure;

FIG. 2 illustrates a non-limiting exemplary first plot 1000 of measured current and fuel flow rate and a non-limiting exemplary second plot 1010 of measured main excitation coil and search coil voltages for two successive fuel injection events having substantially identical current pulses that are separated by a dwell time that is not indicative of being closely spaced, in accordance with the present disclosure;

FIG. 3 illustrates a non-limiting exemplary first plot 1020 of measured current and fuel flow rate and a non-limiting exemplary second plot 1030 of measured main excitation coil and search coil voltages for two successive fuel injection events having substantially identical current pulses that are separated by a dwell time that is indicative of being closely spaced, in accordance with the present disclosure;

DETAILED DESCRIPTION

This disclosure describes the concepts of the presently claimed subject matter with respect to an exemplary application to linear motion fuel injectors. However, the claimed subject matter is more broadly applicable to any linear or non-linear electromagnetic actuator that employs an electrical coil for inducing a magnetic field within a magnetic core resulting in an attractive force acting upon a movable armature. Typical examples include fluid control solenoids, gasoline or diesel or CNG fuel injectors employed on internal combustion engines and non-fluid solenoid actuators for positioning and control.

Figure 1:
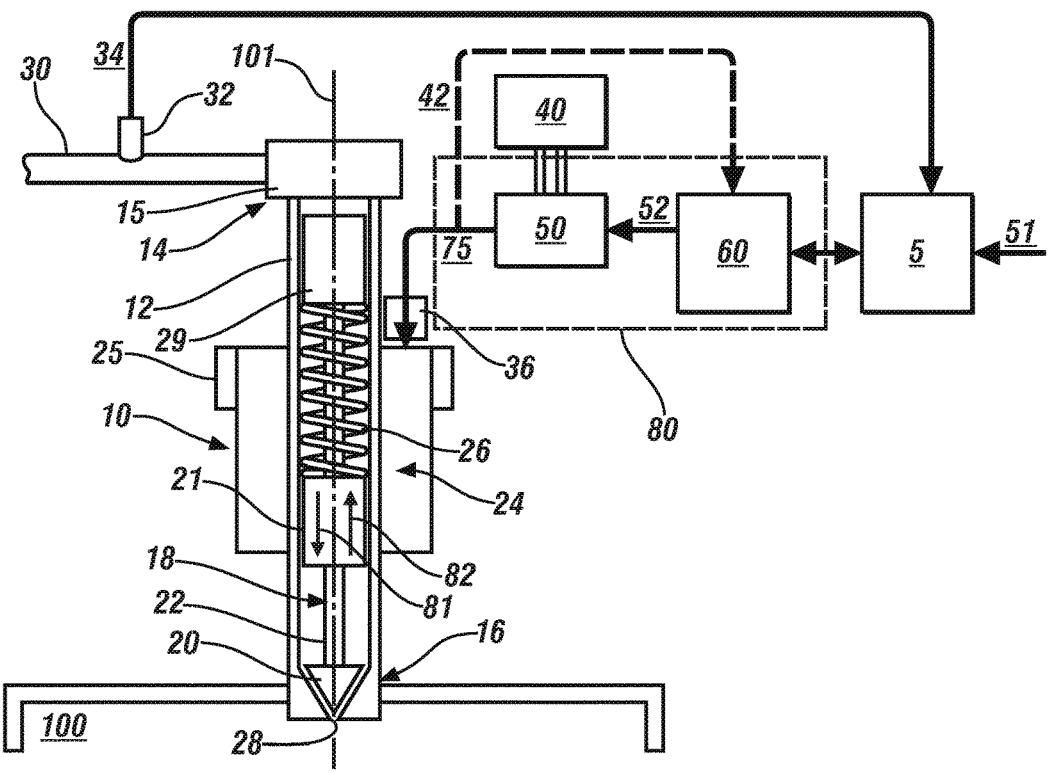
FIG. 1-1 illustrates a schematic sectional view of a fuel injector and an activation controller, in accordance with the present disclosure.

Referring now to the drawings, wherein the showings are for the purpose of illustrating certain exemplary embodiments only and not for the purpose of limiting the same, FIG. 1-1 schematically illustrates a non-limiting exemplary embodiment of an electromagnetically-activated direct-injection fuel injector 10. While an electromagnetically-activated direct-injection fuel injector is depicted in the illustrated embodiment, a port-injection fuel injector is equally applicable. The fuel injector 10 is configured to inject fuel directly into a combustion chamber 100 of an internal combustion engine. An activation controller 80 electrically operatively connects to the fuel injector 10 to control activation thereof. The activation controller 80 corresponds to only the fuel injector 10. In the illustrated embodiment, the activation controller 80 includes a control module 60 and an injector driver 50. The control module 60 electrically operatively connects to the injector driver 50 that electrically operatively connects to the fuel injector 10 to control activation thereof. The fuel injector 10, control module 60 and injector driver 50 may be any suitable devices that are configured to operate as described herein. In the illustrated embodiment, the control module 60 includes a processing device. In one embodiment, one or more components of the activation controller 80 are integrated within a connection assembly 36 of the fuel injector 36. In another embodiment, one or more components of the activation controller 80 are integrated within a body 12 of the fuel injector 10. In even yet another embodiment, one or more components of the activation controller 80 are external to—and in close proximity with—the fuel injector 10 and electrically operatively connected to the connection assembly 36 via one or more cables and/or wires. The terms "cable" and "wire" will be used interchangeably herein to provide transmission of electrical power and/or transmission of electrical signals.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

In general, an armature is controllable to one of an actuated position and a static or rest position. The fuel injector 10 may be any suitable discrete fuel injection device that is controllable to one of an open (actuated) position and a closed (static or rest) position. In one embodiment, the fuel injector 10 includes a cylindrically-shaped hollow body 12 defining a longitudinal axis 101. A fuel inlet 15 is located at a first end 14 of the body 12 and a fuel nozzle 28 (the fuel nozzle may be a single opening or multiple holes in the case of a ball shaped valve) is located at a second end 16 of the body 12. The fuel inlet 15 is fluidly coupled to a high-pressure fuel line 30 that fluidly couples to a high-pressure injection pump. A valve assembly 18 is contained in the body 12, and includes a needle valve 20, a spring-activated pintle 22 and an armature portion 21. The needle valve 20 interferingly seats in the fuel nozzle 28 to control fuel flow therethrough. While the illustrated embodiment depicts a triangularly-shaped needle valve 20, other embodiments may utilize a ball. In one embodiment, the armature portion 21 is fixedly coupled to the pintle 22 and configured to linear translate as a unit with the pintle 22 and the needle valve 20 in first and second directions 81, 82, respectively. In another embodiment, the armature portion 21 may be slidably coupled to the pintle 22. For instance, the armature portion 21 may slide in the first direction 81 until being stopped by a pintle stop fixedly attached to the pintle 22. Likewise, the armature portion 21 may slide in the second direction 82 independent of the pintle 22 until contacting a pintle stop fixedly attached to the pintle 22. Upon contact with the pintle stop fixedly attached to the pintle 22, the force of the armature portion 21 causes the pintle 22 to be urged in the second direction 82 with the armature portion 21. The armature portion 21 may include protuberances to engage with various stops within the fuel injector 10.

An annular electromagnet assembly 24, including an electrical coil and magnetic core, is configured to magnetically engage the armature portion 21 of the valve assembly. The electrical coil and magnetic core assembly 24 is depicted for illustration purposes to be outside of the body of the fuel injector; however, embodiments herein are directed toward the electrical coil and magnetic core assembly 24 to be either integral to, or integrated within, the fuel injector 10. The electrical coil is wound onto the magnetic core, and includes terminals for receiving electrical current from the injector driver 50. Hereinafter, the "electrical coil and magnetic core assembly" will simply be referred to as an "electrical coil 24". When the electrical coil 24 is deactivated and de-energized, the spring 26 urges the valve assembly 18 including the needle valve 20 toward the fuel nozzle 28 in the first direction 81 to close the needle valve 20 and prevent fuel flow therethrough. When the electrical coil 24 is activated and energized, electromagnetic force (herein after "magnetic force") acts on the armature portion 21 to overcome the spring force exerted by the spring 26 and urges the valve assembly 18 in the second direction 82, moving the needle valve 20 away from the fuel nozzle 28 and permitting flow of pressurized fuel within the valve assembly 18 to flow through the fuel nozzle 28. The fuel injector 10 may include a stopper 29 that interacts with the valve assembly 18 to stop translation of the valve assembly 18 when it is urged to open. In one embodiment, a pressure sensor 32 is configured to obtain fuel pressure 34 in the high-pressure fuel line 30 proximal to the fuel injector 10, preferably upstream of the fuel injector 10. In another embodiment, a pressure sensor may be integrated within the inlet 15 of the fuel injector in lieu of the pressure sensor 32 in the fuel rail 30 or in combination with the pressure sensor. The fuel injector 10 in the illustrated embodiment of FIG. 1-1 is not limited to the spatial and geometric arrangement of the features described herein, and may include additional features and/or other spatial and geometric arrangements known in the art for operating the fuel injector 10 between open and closed positions for controlling the delivery of fuel to the engine 100.

The control module 60 generates an injector command signal 52 that controls the injector driver 50, which activates the fuel injector 10 to the open position for affecting a fuel injection event. In the illustrated embodiment, the control module 60 communicates with one or more external control modules such as an engine control module (ECM) 5; however, the control module 60 may be integral to the ECM in other embodiments. The injector command signal 52 correlates to a desired mass of fuel to be delivered by the fuel injector 10 during the fuel injection event. Similarly, the injector command signal 52 may correlate to a desired fuel flow rate to be delivered by the fuel injector 10 during the fuel injection event. As used herein, the term "desired injected fuel mass" refers to the desired mass of fuel to be delivered to the engine by the fuel injector 10. As used herein, the term "desired fuel flow rate" refers to the rate at which fuel is to be delivered to the engine by the fuel injector 10 for achieving the desired mass of fuel. The desired injected fuel mass can be based upon one or more monitored input parameters 51 input to the control module 60 or ECM 5. The one or more monitored input parameters 51 may include, but are not limited to, an operator torque request, manifold absolute pressure (MAP), engine speed, engine temperature, fuel temperature, and ambient temperature obtained by known methods. The injector driver 50 generates an injector activation signal 75 in response to the injector command signal 52 to activate the fuel injector 10. The injector activation signal 75 controls current flow to the electrical coil 24 to generate electromagnetic force in response to the injector command signal 52. An electric power source 40 provides a source of DC electric power for the injector driver 50. In some embodiments, the DC electric power source provides low voltage, e.g., 12 V, and a boost converter may be utilized to output a high voltage, e.g., 24V to 200 V, that is supplied to the injector driver 50. When activated using the injector activation signal 75, the electromagnetic force generated by the electrical coil 24 urges the armature portion 21 in the second direction 82. When the armature portion 21 is urged in the second direction 82, the valve assembly 18 in consequently caused to urge or translate in the second direction 81 to an open position, allowing pressurized fuel to flow therethrough. The injector driver 50 controls the injector activation signal 75 to the electrical coil 24 by any suitable method, including, e.g., pulsewidth-modulate (PWM) electric power flow. The injector driver 50 is configured to control activation of the fuel injector 10 by generating suitable injector activation signals 75. In embodiments that employ a plurality of successive fuel injection events for a given engine cycle, an injector activation signal 75, that is fixed for each of the fuel injection events within the engine cycle, may be generated.

The injector activation signal 75 is characterized by an injection duration and a current waveform that includes an initial peak pull-in current and a secondary hold current. The initial peak pull-in current is characterized by a steady-state ramp up to achieve a peak current, which may be selected as described herein. The initial peak pull-in current generates electromagnetic force that acts on the armature portion 21 of the valve assembly 18 to overcome the spring force and urge the valve assembly 18 in the second direction 82 to the open position, initiating flow of pressurized fuel through the fuel nozzle 28. When the initial peak pull-in current is achieved, the injector driver 50 reduces the current in the electrical coil 24 to the secondary hold current. The secondary hold current is characterized by a somewhat steady-state current that is less than the initial peak pull-in current. The secondary hold current is a current level controlled by the injector driver 50 to maintain the valve assembly 18 in the open position to continue the flow of pressurized fuel through the fuel nozzle 28. The secondary hold current is preferably indicated by a minimum current level. When very small fuel quantities are required, the activation current waveform will not reach its peak and the current hold phase will be omitted in that case. The injector driver 50 is configured as a bi-directional current driver capable of providing a negative current flow for drawing current from the electrical coil 24. As used herein, the term "negative current flow" refers to the direction of the current flow for energizing the electrical coil to be reversed. Accordingly, the terms "negative current flow" and "reverse current flow" are used interchangeably herein.

Embodiments herein are directed toward controlling the fuel injector for a plurality of fuel injection events that are closely-spaced during an engine cycle. As used herein, the term "closely-spaced" refers to a dwell time between each consecutive fuel injection event being less than a predetermined dwell time threshold. As used herein, the term "dwell time" refers to a period of time between an end of injection for the first fuel injection event (actuator event) and a start of injection for a corresponding second fuel injection event (actuator event) of each consecutive pair of fuel injection events. The dwell time threshold can be selected to define a period of time such that dwell times less than the dwell time threshold are indicative of producing instability and/or deviations in the magnitude of injected fuel mass delivered for each of the fuel injection events. The instability and/or deviations in the magnitude of injected fuel mass may be responsive to a presence of secondary magnetic effects. The secondary magnetic effects include persistent eddy currents and magnetic hysteresis within the fuel injector and a residual flux based thereon. The persistent eddy currents and magnetic hysteresis are present due to transitions in initial flux values between the closely-spaced fuel injection events. Accordingly, the dwell time threshold is not defined by any fixed value, and selection thereof may be based upon, but not limited to, fuel temperature, fuel injector temperature, fuel injector type, fuel pressure and fuel properties such as fuel types and fuel blends. As used herein, the term "flux" refers to magnetic flux indicating the total magnetic field generated by the electrical coil 24 and passing through the armature portion. Since the turns of the electrical coil 24 link the magnetic flux in the magnetic core, this flux can therefore be equated from the flux linkage. The flux linkage is based upon the flux density passing through the armature portion, the surface area of the armature portion adjacent to the air gap and the number of turns of the coil 24. Accordingly, the terms "flux", "magnetic flux" and "flux linkage" will be used interchangeably herein unless otherwise stated.

For fuel injection events that are not closely spaced, a fixed current waveform independent of dwell time may be utilized for each fuel injection event because the first fuel injection event of a consecutive pair has little influence on the delivered injected fuel mass of the second fuel injection event of the consecutive pair. However, the first fuel injection event may be prone to influence the delivered injected fuel mass of the second fuel injection event, and/or further subsequent fuel injection events, when the first and second fuel injection events are closely-spaced and a fixed current wave form is utilized. Any time a fuel injection event is influenced by one or more preceding fuel injection events of an engine cycle, the respective delivered injected fuel mass of the corresponding fuel injection event can result in an unacceptable repeatability over the course of a plurality of engine cycles and the consecutive fuel injection events are considered closely-spaced. More generally, any consecutive actuator events wherein residual flux from the preceding actuator event affects performance of the subsequent actuator event relative to a standard, for example relative to performance in the absence of residual flux, are considered closely-spaced.

Figures 1, 2:
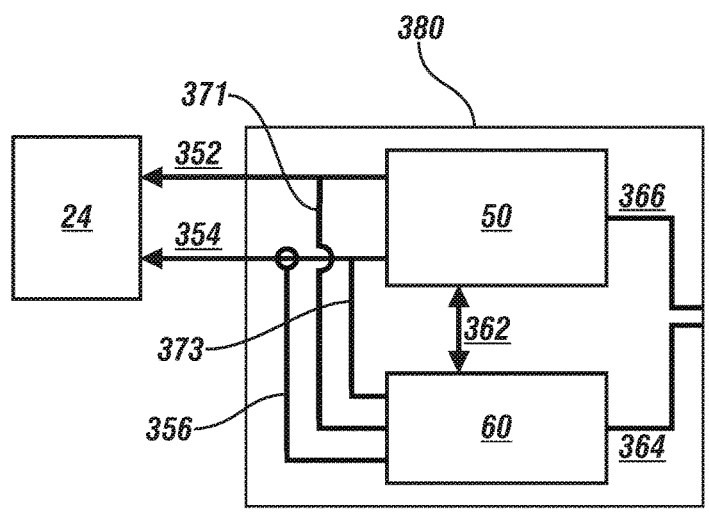

FIG. 2 illustrates a non-limiting exemplary first plot 1000 of measured current and fuel flow rate and a non-limiting exemplary second plot 1010 of measured main excitation coil and search coil voltages for two successive fuel injection events having substantially identical current pulses that are separated by a dwell time that is not indicative of being closely spaced, in accordance with the present disclosure. Dashed vertical line 1001 extending through each of plots 1000 and 1010 represents a first time whereat an end of injection for the first fuel injection event occurs and dashed vertical line 1002 represents a second time whereat a start of injection for the second fuel injection event occurs. The dwell time 1003 represents a period of time between dashed vertical lines 1001 and 1002 separating the first and second fuel injection events. In the illustrated embodiment, the dwell time exceeds a dwell time threshold. Thus, the first and second fuel injection events are not indicative of being closely-spaced.

Referring to the first plot 1000, measured current and flow rate profiles 1011, 1012, respectively, are illustrated for the two fuel injection events. The vertical y-axis along the left side of plot 1000 denotes electrical current in Amperage (A) and the vertical y-axis along the right side of plot 1000 denotes fuel flow rate in milligrams (mg) per milliseconds (ms). The measured current profile 1011 is substantially identical for each of the fuel injection events. Likewise, the measured fuel flow rate profile 1012 is substantially identical for each of the fuel injection events due to the fuel injection events not indicative of being closely-spaced.

Referring to the second plot 1010, measured main excitation coil and search coil voltage profiles 1013, 1014, respectively, are illustrated for the two fuel injection events. The measured main coil voltage may represent a measured voltage of the electromagnetic coil 24 of FIG. 1-1 and the measured search coil voltage may represent a measured voltage of a search coil mutually magnetically coupled to the electromagnetic coil 24 of FIG. 1-1. The vertical y-axis of plot 1010 denotes voltage (V). Accordingly, when the main excitation coil is energized, magnetic flux generated by the main excitation coil may be linked to the search coil due to the mutual magnetic coupling. The measured search coil voltage profile 1014 indicates the voltage induced in the search coil which is proportional to the rate of change of the mutual flux-linkage. The measured main excitation coil and search coil voltage profiles 1013, 1014, respectively, of plot 1010 are substantially identical for each of the first and second fuel injection events that are not indicative of being closely-spaced.

Figures 1, 2, 3:
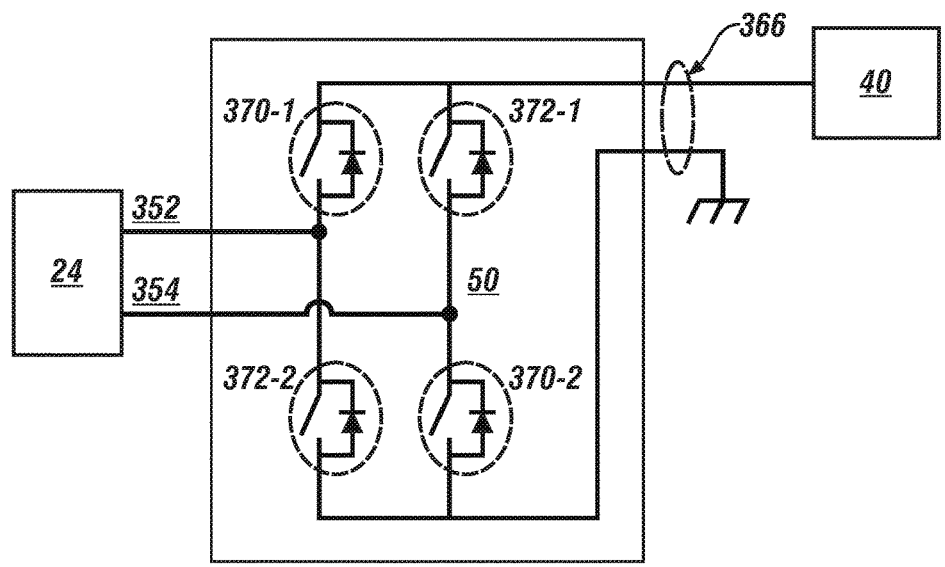
Figure 2:
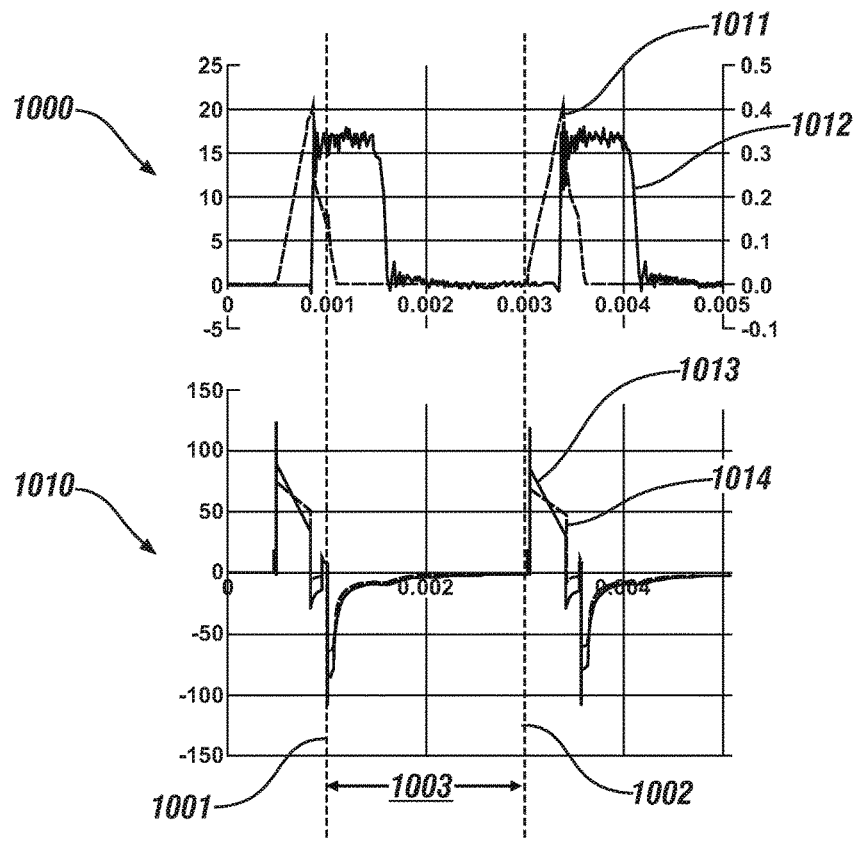
Figure 3:
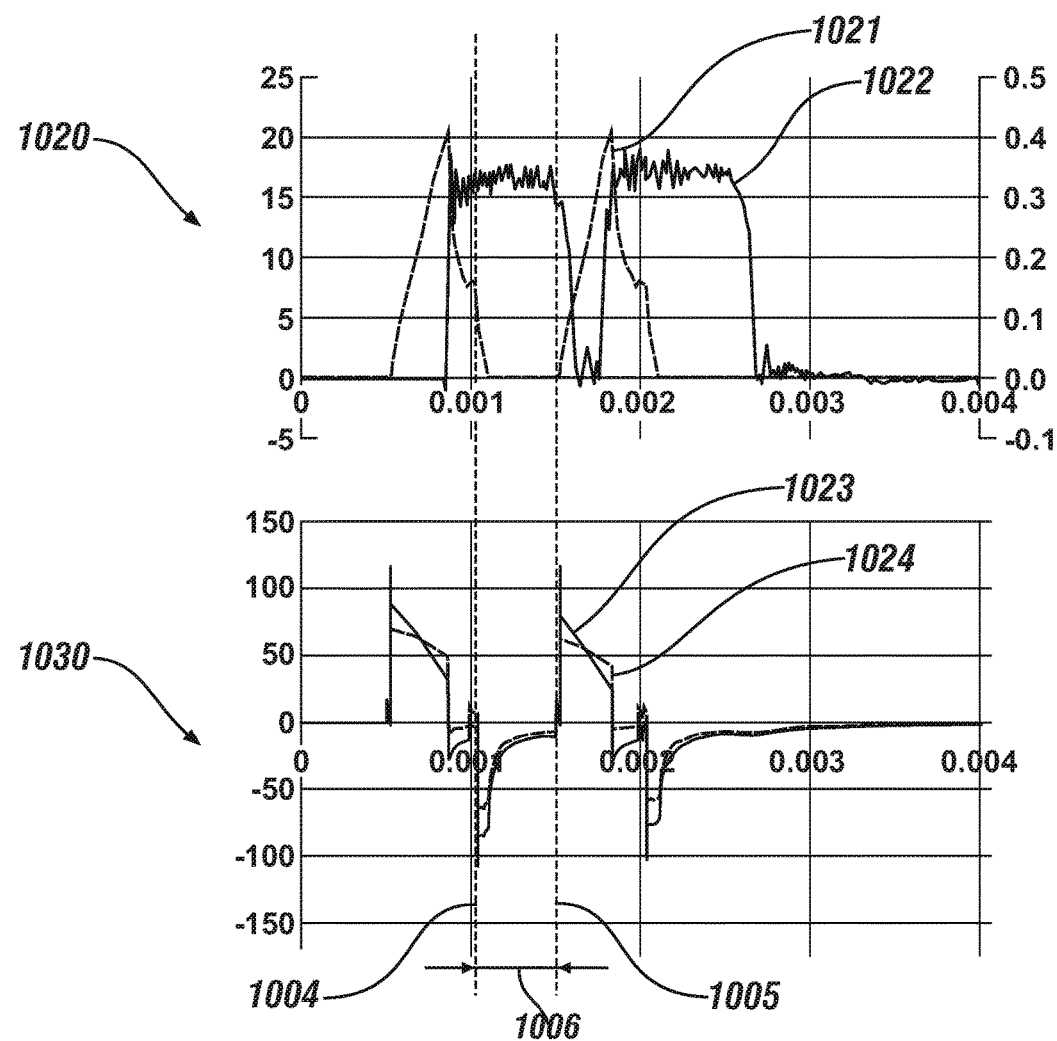

FIG. 3 illustrates a non-limiting exemplary first plot 1020 of measured current and fuel flow rate and a non-limiting exemplary second plot 1030 of measured main excitation coil and search coil voltages for two successive fuel injection events having substantially identical current pulses that are separated by a dwell time that is indicative of being closely spaced, in accordance with the present disclosure. The horizontal x-axis in each of plots 1020 and 1030 denotes time in seconds (s). Dashed vertical line 1004 extending through each of plots 1020 and 1030 represents a first time whereat an end of injection for the first fuel injection event occurs and dashed vertical line 1005 represents a second time whereat a start of injection for the second fuel injection event occurs. The dwell time 1006 represents a period of time between dashed vertical lines 1004 and 1005 separating the first and second fuel injection events. In the illustrated embodiment, the dwell time is less than a dwell time threshold. Thus, the first and second fuel injection events are indicative of being closely-spaced.

Referring to the first plot 1020, measured current and flow rate profiles 1021, 1022, respectively, are illustrated for the two fuel injection events. The vertical y-axis along the left side of plot 1020 denotes electrical current in Amperage (A) and the vertical y-axis along the right side of plot 1020 denotes fuel flow rate in milligrams (mg) per millisecond (ms). The measured current profile 1021 is substantially identical for each of the fuel injection events. However, the measured flow rate profile 1022 illustrates a variation in the measured fuel flow rate between each of the first and second fuel injection events even though the measured current profiles are substantially identical. This variance in the measured fuel flow rate is inherent in closely-spaced fuel injection events and undesirably results in an injected fuel mass delivered at the second fuel injection event that is different than an injected fuel mass delivered at the first fuel injection event.

Referring to the second plot 1030, measured main excitation coil and search coil voltage profiles 1023, 1024, respectively, are illustrated for the two fuel injection events. The measured main coil voltage may represent a measured voltage of the electrical coil 24 of FIG. 1-1 and the measured search coil voltage may represent a measured voltage of a search coil mutually magnetically coupled to the electrical coil 24 of FIG. 1-1. The vertical y-axis of plot 1030 denotes voltage (V). Accordingly, when the main excitation coil is energized, magnetic flux generated by the main excitation coil may be linked to the search coil due to the mutual magnetic coupling. The measured search coil voltage profile 1024 indicates the voltage induced in the search coil which is proportional to the rate of change of the mutual flux-linkage. The measured main excitation coil and search coil voltage profiles 1023, 1024, respectively, of plot 1030 fluctuate during the second injection event in comparison to the first fuel injection event. This fluctuation is indicative of the presence of residual flux or magnetic flux when the injection events are closely-spaced. Referring to plot 1010 of FIG. 2 the measured main excitation coil and search coil voltage profiles 1013, 1014, respectively do not fluctuate during the second injection event in comparison to the first fuel injection event when the first and second fuel injection events are not closely-spaced.

Referring back to FIG. 1-1, exemplary embodiments are further directed toward providing feedback signal(s) 42 from the fuel injector 10 back to the control module 60 and/or the injector driver 50. Discussed in greater detail below, sensor devices may be integrated within the fuel injector 10 for measuring various fuel injector parameters for obtaining the flux linkage of the electrical coil 24, voltage of the electrical coil 24 and current through the electrical coil 24. A current sensor may be provided on a current flow path between the activation controller 80 and the fuel injector to measure the current provided to the electrical coil or the current sensor can be integrated within the fuel injector 10 on the current flow path. The fuel injector parameters provided via feedback signal(s) 42 may include the flux linkage, voltage and current directly measured by corresponding sensor devices integrated within the fuel injector 10. Additionally or alternatively, the fuel injector parameters may include proxies provided via feedback signal(s) 42 to—and used by—the control module 60 to estimate the flux linkage, magnetic flux, the voltage, and the current within the fuel injector 10. Having feedback of the flux linkage of the electrical coil 24, the voltage of the electrical coil 24 and current provided to the electrical coil 24, the control module 60 may advantageously modify the activation signal 75 to the fuel injector 10 for multiple consecutive injection events. It will be understood that conventional fuel injectors are controlled by open loop operation based solely upon a desired current waveform obtained from look-up tables without any information related to the force producing component of the flux linkage (e.g., magnetic flux) affecting movement of the armature portion 21. As a result, conventional feed-forward fuel injectors that only account for current flow for controlling the fuel injector 10, are prone to instability in consecutive fuel injection events that are closely-spaced.

It is known when the injector driver 50 only provides current unidirectionally in a positive first direction to energize the electrical coil 24, releasing the current to remain stable at zero will result in the magnetic flux within the fuel injector to gradually decay, e.g., taper off, towards zero. However, the response time for the magnetic flux to decay is slow, and the presence of magnetic hysteresis within the fuel injector often results in the presence of residual flux when a subsequent closely-spaced fuel injection event is initiated. As aforementioned, the presence of the residual flux impacts the accuracy of the fuel flow rate and injected fuel mass to be delivered in a subsequent fuel injection event, wherein the presence of the residual flux is enhanced for closely spaced fuel injection events.

FIG. 1-2 illustrates the activation controller 80 of FIG. 1-1, in accordance with the present disclosure. Signal flow path 362 provides communication between the control module 60 and the injector driver 50. For instance, signal flow path 362 provides the injector command signal (e.g., command signal 52 of FIG. 1-1) that controls the injector driver 50. The control module 60 further communicates with the external ECM 5 via signal flow path 364 within the activation controller 380 that is in electrical communication with a power transmission cable. For instance, signal flow path 364 may provide monitored input parameters (e.g., monitored input parameters 51 of FIG. 1-1) from the ECM 5 to the control module 60 for generating the injector command signal 52. In some embodiments, the signal flow path 364 may provide feedback fuel injector parameters (e.g., feedback signal(s) 42 of FIG. 1-1) to the ECM 5.

The injector driver 50 receives DC electric power from the power source 40 of FIG. 1-1 via a power supply flow path 366. The signal flow path 364 can be eliminated by use of a small modulation signal added to the power supply flow path 366. Using the received DC electric power, the injector driver 50 may generate injector activation signals (e.g., injector activation signals 75 of FIG. 1-1) based on the injector command signal from the control module 60.

The injector driver 50 is configured to control activation of the fuel injector 10 by generating suitable injector activation signals 75. The injector driver 350 is a bi-directional current driver providing positive current flow via a first current flow path 352 and negative current flow via a second current flow path 354 to the electrical coil 24 in response to respective injector activation signals 75. The positive current via the first current flow path 352 is provided to energize an electrical coil 24 and the negative current via the second current flow path 354 reverses current flow through the electrical coil 24. Current flow paths 352 and 354 form a closed loop; that is, a positive current into 352 results in an equal and opposite (negative) current in flow path 354, and vice versa. Signal flow path 371 can provide a voltage of the first current flow path 352 to the control module 60 and signal flow path 373 can provide a voltage of the second current flow path 354 to the control module 60. The voltage and current applied to the electrical coil 24 is based on a difference between the voltages at the signal flow paths 371 and 373. In one embodiment, the injector driver 50 utilizes open loop operation to control activation of the fuel injector 10, wherein the injector activation signals are characterized by precise predetermined current waveforms. In another embodiment, the injector driver 50 utilizes closed loop operation to control activation of the fuel injector 10, wherein the injector activation signals are based upon fuel injector parameters provided as feedback to the control module, via the signal flow paths 371 and 373. A measured current flow to the coil 24 can be provided to the control module 60, via signal flow path 356. In the illustrated embodiment, the current flow is measured by a current sensor on the second current flow path 354. The fuel injector parameters may include flux linkage, voltage and current values within the fuel injector 10 or the fuel injector parameters may include proxies used by the control module 60 to estimate flux linkage, voltage and current within the fuel injector 10.

In some embodiments, the injector driver 50 is configured for full four quadrant operation. FIG. 1-3 illustrates an exemplary embodiment of the injector driver 50 of FIGS. 1-2 utilizing two switch sets 370 and 372 to control the current flow provided between the injector driver 50 and the electrical coil 24. In the illustrated embodiment, the first switch set 370 includes switch devices 370-1 and 370-2 and the second switch set 372 includes switch devices 372-1 and 372-2. The switch devices 370-1, 370-2, 372-1, 372-2 can be solid state switches and may include Silicon (Si) or wide band gap (WBG) semiconductor switches enabling high speed switching at high temperatures. The four quadrant operation of the injector driver 50 controls the direction of current flow into and out of the electrical coil 24 based upon a corresponding switch state determined by the control module 60. The control module 60 may determine a positive switch state, a negative switch state and a zero switch state and command the first and second switch sets 370 and 372 between open and closed positions based on the determined switch state. In the positive switch state, the switch devices 370-1 and 370-2 of the first switch set 370 are commanded to the closed position and the switch devices 372-1 and 372-2 of the second switch set 372 are commanded to the open position to control positive current into the first current flow path 352 and out of the second current flow path 354. These switch devices may be further modulated using pulse width modulation to control the amplitude of the current. In the negative switch state, the switch devices 370-1 and 370-2 of the first switch set 370 are commanded to the open position and the switch devices 372-1 and 372-2 of the second switch set 372 are commanded to the closed position to control negative current into the second current flow path 354 and out of the first current flow path 352. These switch devices may be further modulated using pulse width modulation to control the amplitude of the current. In the zero switch state, all the switch devices 370-1, 370-2, 372-1, 372-2 are commanded to the open position to control no current into or out of the electromagnetic assembly. Thus, bi-directional control of current through the coil 24 may be effected.

In some embodiments, the negative current for drawing current from the electrical coil 24 is applied for a sufficient duration for reducing residual flux within the fuel injector 10 after a secondary hold current is released. In other embodiments, the negative current is applied subsequent to release of the secondary hold current but additionally only after the fuel injector has closed or actuator has returned to its static or rest position. Moreover, additional embodiments can include the switch sets 370 and 372 to be alternately switched between open and closed positions to alternate the direction of the current flow to the coil 24, including pulse width modulation control to effect current flow profiles. The utilization of two switch sets 370 and 372 allows for precise control of current flow direction and amplitude applied to the current flow paths 352 and 354 of the electrical coil 24 for multiple consecutive fuel injection events during an engine event by reducing the presence of eddy currents and magnetic hysteresis within the electrical coil 24.

Embodiments herein are directed toward alternating a polarity of current excitation for the electrical coil 24 of FIG. 1-1 during each successive fuel injection event amongst a plurality of consecutive fuel injection events that are separated by dwell times indicative of being closely spaced. However, embodiments herein are similarly applicable to consecutive fuel injection events separated by dwell times that are not indicative of being closely spaced. Moreover, each of the consecutive fuel injection events can be indicative of delivering small injected fuel masses into the combustion chamber 100. As will become apparent when described below with reference to non-limiting plots 400 and 500 of FIGS. 4 and 5, respectively, alternating the polarity of current excitation for the electrical coil 24 during each successive fuel injection event compensates for the negative effects of magnetic hysteresis and persistent residual flux responsive to eddy currents induced in the fuel injector by providing faster and more precise control of the injected fuel mass delivered during each fuel injection event.

The injector driver 50 includes the bi-directional current driver capable of switching between positive current flow provided to the electrical coil 24 in one direction and negative current flow provided to the electrical coil 24 in a reversed direction, as described above with reference to FIGS. 1-2 and 1-3. As used herein, the term "alternating a polarity of current excitation for the electrical coil 24" refers to energizing the electrical coil 24 during an instantaneous fuel injection event with current flow provided in a first direction when the injector is commanded to open, and energizing the electrical coil 24 during an immediately subsequent fuel injection event with current flow provided in a reversed second direction when the injector is commanded to open. The first direction of current flow can include either one of a positive current flow (e.g., input via signal flow path 352 and output via signal flow path 354 of FIG. 1-3) and a negative current flow (e.g., input via signal flow path 354 and output via signal flow path 352 of FIG. 1-3) and the reversed second direction of current flow includes the other one of the positive current flow and the negative current flow. Moreover, current waveforms for each of the consecutive fuel injection events can be bi-directional current waveforms, whereat one of positive and negative current flow is provided to energize the electrical coil 24 when the injector is commanded to open, and when the injector is commanded to close, the direction of the current flow provided to the electrical coil 24 is reversed to the other one of the positive and negative current flow to rapidly reset the presence of residual magnetic flux prior to a subsequent fuel injection event.

Figure 4:
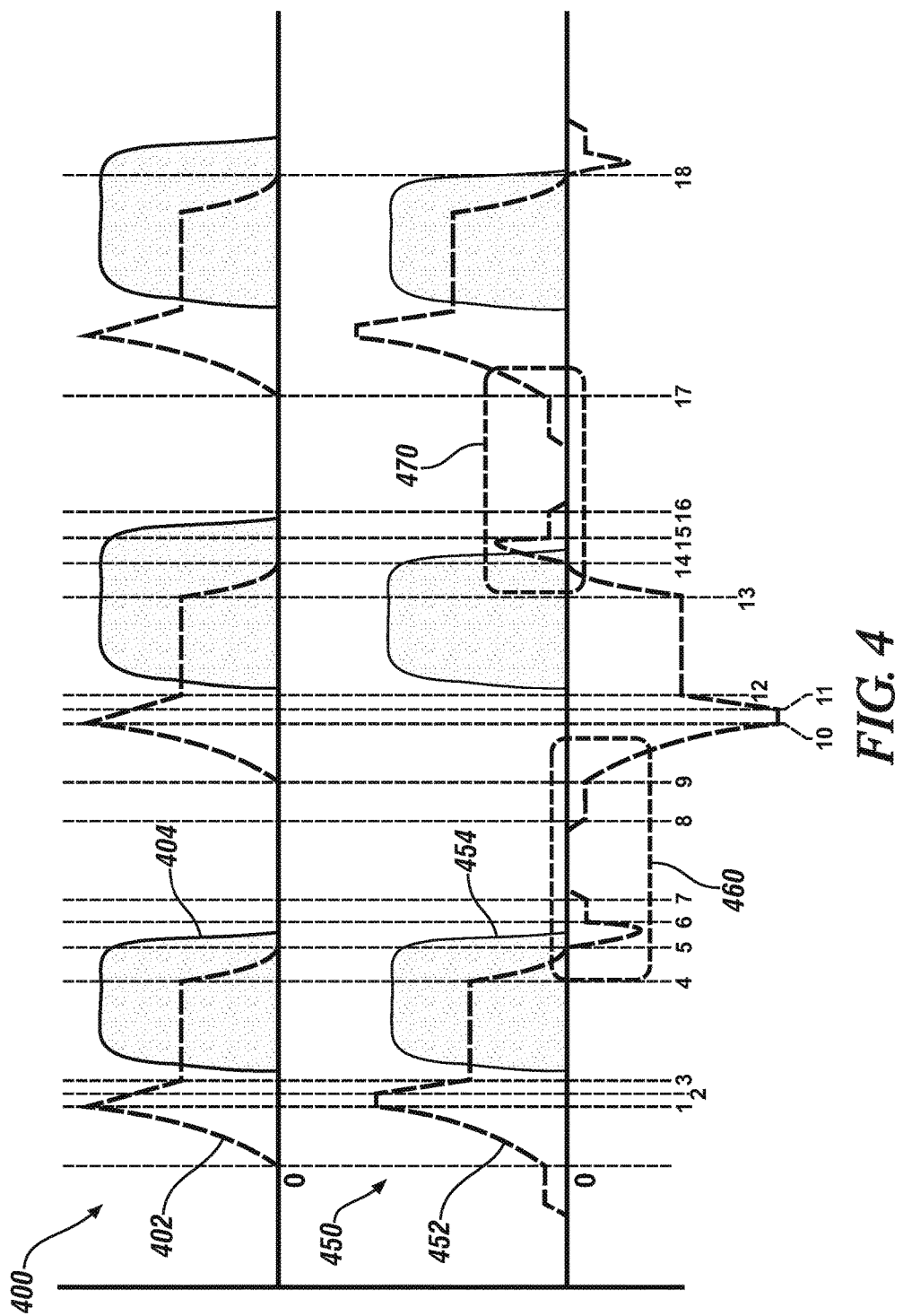
FIG. 4 illustrates non-limiting exemplary plots 400 and 450 comparing measured current and fuel flow rate for a plurality of unidirectional current waveforms each characterized by an identical polarity and a plurality of bi-directional current waveforms each characterized by a corresponding polarity that is inversed from a corresponding polarity of any adjacent ones of the bi-directional current waveforms, in accordance with the present disclosure.

FIG. 4 illustrates non-limiting exemplary plots 400 and 450 comparing measured current and fuel flow rate for a plurality of unidirectional current waveforms each characterized by an identical polarity and a plurality of bi-directional current waveforms each characterized by a corresponding polarity that is inversed from a corresponding polarity of any adjacent ones of the bi-directional current waveforms, in accordance with the present disclosure. As used herein the term "adjacent ones of the bi-directional current waveforms" refers to any current waveform that either immediately precedes, or immediately succeeds, an instantaneous bi-directional current waveform. Plots 400 and 450 include measured current profile lines 402, 452, respectively, and measured fuel flow rate profile lines 404, 454, respectively. The horizontal x-axis in each of plots 400 and 450 denotes time increasing from zero at the origin. The vertical y-axis in each of plots 400 and 450 denotes magnitudes increasing from zero at the origin for electrical current provided to a fuel injector (e.g., electrical coil 24 of FIG. 1) and injected fuel mass delivered to an engine (e.g., combustion chamber 100 of FIG. 1). Dashed vertical lines 0 thru 18 include points in time during three consecutive fuel injection events.

Referring to plot 400, a first unidirectional current waveform for the first fuel injection event is depicted between times 0 and 5; a second unidirectional current waveform for the second fuel injection event is depicted between times 9 and 15; and the third unidirectional current waveform for a third fuel injection event is depicted between times 17 and 18. Each of the unidirectional current waveforms include a similar shape characterized by a duration, an initial peak pull-in current and a secondary hold current. In response to an injector open command at time 0, the measured current profile line 402 increases to the initial peak pull-in current at time 1. The unidirectionally applied current is reduced between times 1 and 3, whereat the measured current profile line 402 indicates the secondary hold current between times 3 and 4. The secondary hold current is released to zero at time 5, in response to an injector close command at time 4. The second and third unidirectional current waveforms include similar shapes and durations beginning at times 9 and 17, respectively. The first and second unidirectional current waveforms are separated by a dwell time between times 5 and 9, and the second and third unidirectional current waveforms are separated by a dwell time between times 14 and 17. The duration of the dwell times is identical and can be indicative of being closely spaced. Plot 400 illustrates that the measured fuel flow rate profile line 404 indicates a longer delivery of fuel for the second and third fuel injection events compared to that of the first fuel injection event even though the unidirectional current waveforms are substantially identical for each of the fuel injection events. It is desired that the delivery of fuel and injected fuel mass for each of the fuel injection events be identical. This deviation in the increased delivery of fuel is due to secondary magnetic effects (e.g., eddy currents and residual flux due to magnetic hysteresis) in the injector's soft magnetic metals (e.g., stainless steel) that are present when the second and third fuel injection events occur. It will be appreciated that while the unidirectional current of plot 400 illustrates a positive current flow, the unidirectional current of plot 400 could be a negative current flow instead.

Referring to plot 450, a first bi-directional current waveform for the first fuel injection event is depicted between times 0 and 7; a second bi-directional current waveform for the second fuel injection event is depicted between times 9 and 16; and the third bidirectional current waveform for a third fuel injection event is depicted from time 17 until after time 18. Each of the bi-directional current waveforms include a similar shape characterized by a duration, an initial peak pull-in current and a secondary hold current; however the polarity of the measured current profile line 452 is alternating between each successive bi-directional current waveform, whereat the second bi-directional current waveform includes a corresponding polarity that is inversed to that of the corresponding polarity of the first and third bi-directional current waveforms. It will be appreciated that the bi-directional current waveforms are based upon a desired injected fuel mass to be delivered. The bi-directional current waveforms can be further based upon dwell times separating consecutive fuel injection events. Moreover, the shape and/or duration of the second and/or third bi-directional current waveforms can include minor adjustments to improve the consistency of the injected fuel mass delivered, especially when multiple closely spaced injections are used.

The measured current profile line 452 indicates a probing current (e.g., response to a probing voltage) that can be applied prior to the injector open command at time 0 for the first fuel injection event. The probing current for the first fuel injection event includes a positive current flow of a sufficiently small magnitude below a current threshold whereat injector opening occurs. In response to the injector open command at time 0, the measured current profile line 452 increases to achieve the initial peak pull-in current at time 1. The initial peak pull-in current may be maintained for a short duration between times 1 and 2. Maintaining peak pull-in currents for short durations is desirable in scenarios when applying an optimum peak pull-in current may not be desirable or achievable due to power constraints. In such scenarios, a peak-pull in current with a lower magnitude than the optimum peak pull-in current can be applied for a short duration to attain a desired excitation of an electrical coil. The measured current profile line 452 is reduced between times 2 and 3, whereat the measured current profile line 452 indicates the secondary hold current between times 3 and 4. In response to the injector close command at time 4, the measured current profile line 452 of the first bi-directional current waveform is released to zero at time 5 and the electrical current flow into the fuel injector (e.g., the electrical coil 24 of FIG. 1) is reversed in the negative direction until achieving a negative peak current between times 5 and 6. Applying the reversed negative current flow to achieve the negative peak current is effective to cancel out the effect of induced eddy currents in order to improve the magnetic force response acting upon an armature (e.g., armature portion 21) within the fuel injector. Upon achieving the negative peak current between times 5 and 6, the magnitude of the reversed negative current flow is reduced (e.g., measured current profile line 452 is increased) to a small negative value at time 6. Thereafter, the measured current profile line 452 maintains the small negative value between times 6 and 7 to counter the presence of residual magnetic flux caused by the first fuel injection event due to the magnetic hysteresis. At time 7, the reversed negative current flow is released to zero for a period of time until a probing current is applied at time 8 prior to the injector open command at time 9 for the second fuel injection event. Accordingly, area 460 within plot 450 represents periods of reversed current flow in the negative direction to cancel out the effects of induced eddy currents from the first fuel injection event and counter the presence of residual magnetic flux caused by the first fuel injection event due to the magnetic hysteresis.

The measured current profile line 452 indicates the probing current (e.g., responsive to a probing voltage) between times 8 and 9 that can be applied prior to the injector open command at time 0 for the second fuel injection event. In contrast to the probing current for the first fuel injection event, the probing current for the second fuel injection event includes an inversed plurality; whereat a negative current flow of a sufficiently small magnitude below the current threshold is applied. It will be understood that the magnitude of the probing current for the second fuel injection event is identical to the magnitude of the probing current for the first fuel injection event.

The second bi-directional current waveform is characterized by a similar duration and a similar shape to that of the first bi-directional current waveform; however, the second bi-directional current waveform includes an alternating polarity that is inversed from the polarity of the first bi-directional current waveform. In response to the injector open command at time 9, the measured current profile line 452 decreases to achieve an initial negative peak pull-in current at time 10 that is maintained for a short duration until time 11. Here, the magnitude of the initial negative peak pull-in current between times 10 and 11 for the second bi-directional current waveform is substantially similar to the magnitude of the initial peak pull-in current between times 1 and 2 for the first bi-directional current wave form. Thereafter, the measured current profile line 452 is increased between times 11 and 12, whereat a secondary negative hold current occurs between times 12 and 13. Here, the magnitude and duration of the secondary negative hold current between times 12 and 13 is substantially identical to the magnitude and duration of the secondary hold current between times 3 and 4 for the first bi-directional current waveform. In response to the injector close command at time 13, the measured current profile line 452 of the second bi-directional current waveform is released to zero at time 14 and the electrical current flow into the fuel injector (e.g., the electrical coil 24 of FIG. 1) is reversed in the positive direction until achieving a positive peak current between times 14 and 15. Here, the positive peak current corresponds to the negative peak current between times 5 and 6 for the first fuel injection event, except that the positive peak current includes a polarity that is inversed. Applying the reversed positive current flow to achieve the positive peak current is effective to cancel out the effect of induced eddy currents in order to improve the magnetic force response acting upon the armature (e.g., armature portion 21) within the fuel injector. Upon achieving the positive peak current between times 14 and 15, the magnitude of the reversed positive current flow is reduced (e.g., measured current profile line 452 is decreased) to a small positive value at time 15. Thereafter, the measured current profile line 452 maintains the small positive value between times 15 and 16 to counter the presence of residual magnetic flux caused by the second fuel injection event due to the magnetic hysteresis. At time 16, the reversed positive current flow is released to zero for a period of time until a probing current is applied prior to the injector open command at time 17 for the third fuel injection event. Accordingly, area 470 within plot 450 represents periods of reversed current flow in the positive direction to cancel out the effects of induced eddy currents from the second fuel injection event and counter the presence of residual magnetic flux caused by the second fuel injection event due to the magnetic hysteresis.

The third bi-directional current waveform includes an alternating polarity that is inversed from the polarity of the second bi-directional current waveform. Therefore, the polarity of the third bi-directional current waveform is the same as that of the first bi-directional current waveform. The third bi-directional current waveform can be described with reference to the first bi-directional current waveform.

It will be appreciated that inversing the polarity of the bi-directional current waveform for each successive fuel injection event assists in quickly extinguishing persistent magnetic flux due to induced eddy currents and drives a magnetic operating point through four quadrants of a material magnetic B-H loop within the fuel injector to reduce residual magnetism due to hysteresis.

In contrast to the unidirectional current waveforms of plot 400, the bi-directional current waveforms with alternating polarity of plot 450 each include the same duration for the delivery of fuel, as indicated by fuel flow delivery profile line 454. Accordingly, the injected fuel mass is consistent and stable for each of the fuel injection events due to the bi-directional current waveforms with alternating polarity cancelling and/or countering the undesirable presence the secondary magnetic effects (e.g., eddy currents, residual flux and magnetic hysteresis) in the injector's soft magnetic metals (e.g., stainless steel).

This disclosure is not limited to three consecutive fuel injection events, wherein embodiments herein are equally applicable to any fuel injection strategy that employs multiple successive fuel injection events, e.g., two consecutive fuel injection events or more than three consecutive fuel injection events.

Figure 5:
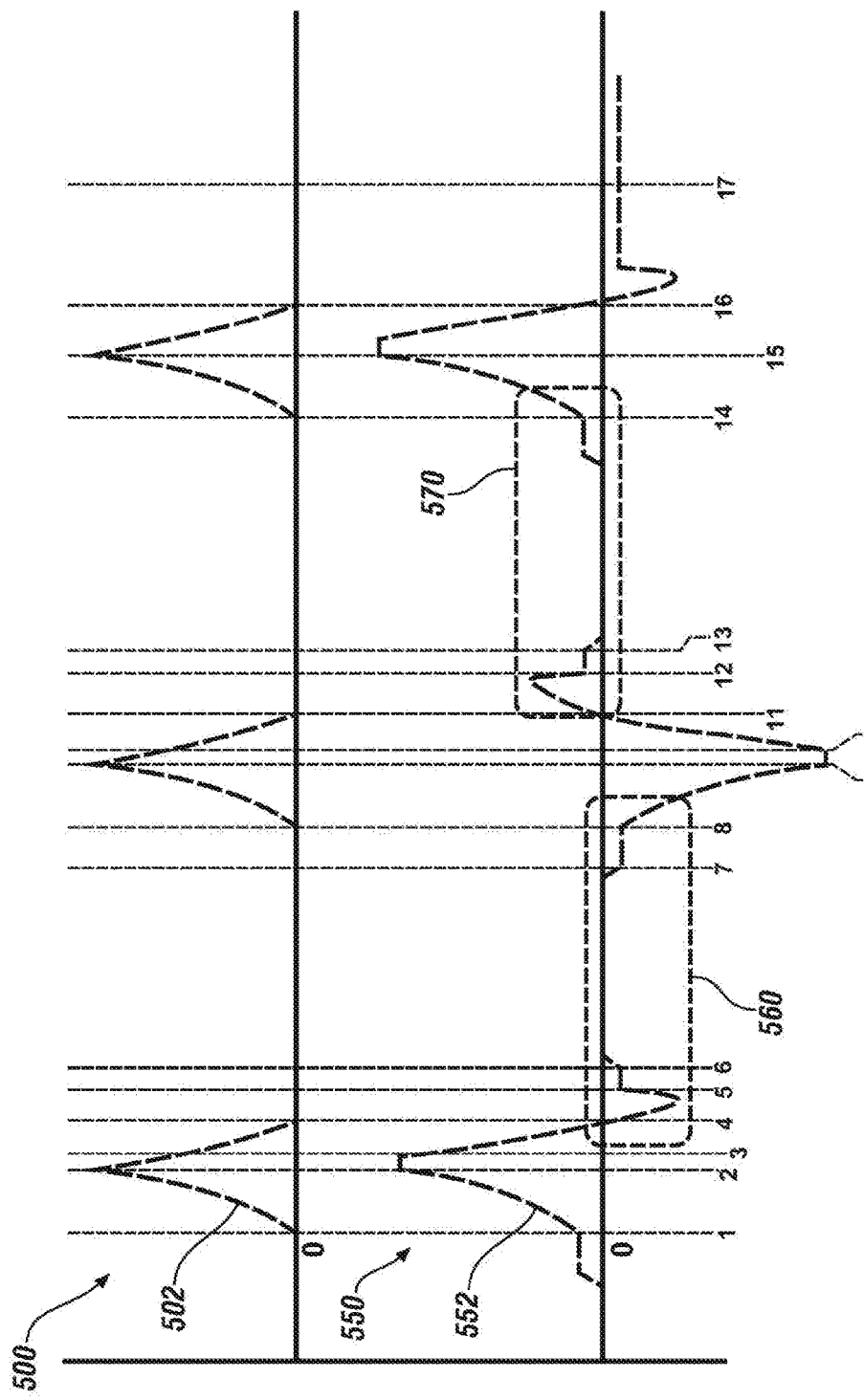
FIG. 5 illustrates non-limiting exemplary plots 500 and 550 comparing measured current for a plurality of unidirectional current waveforms each characterized by an identical polarity and a plurality of bi-directional current waveforms each characterized by a corresponding polarity that is inversed from a corresponding polarity of any adjacent ones of the bi-directional current waveforms, in accordance with the present disclosure.

FIG. 5 illustrates non-limiting exemplary plots 500 and 550 comparing measured current for a plurality of unidirectional current waveforms each characterized by an identical polarity and a plurality of bi-directional current waveforms each characterized by a corresponding polarity that is inversed from a corresponding polarity of any adjacent ones of the bi-directional current waveforms, in accordance with the present disclosure. Plots 500 and 550 include measured current profile lines 502, 552, respectively. The horizontal x-axis in each of plots 500 and 550 denotes time increasing from zero at the origin. The vertical y-axis in each of plots 500 and 550 denotes magnitudes increasing from zero at the origin for electrical current provided to a fuel injector (e.g., electrical coil 24 of FIG. 1). Dashed vertical lines 0 thru 17 include points in time during three consecutive fuel injection events.

Referring to plot 500, a first unidirectional current waveform for the first fuel injection event is depicted between times 0 and 3; a second unidirectional current waveform for the second fuel injection event is depicted between times 7 and 10; and the third unidirectional current waveform for a third fuel injection event is depicted between times 13 and 15. The unidirectional current waveforms of plot 500 are substantially similar to the unidirectional current waveforms of plot 400 of FIG. 4, except the unidirectional current waveforms of plot 500 are not characterized by a secondary holding current. For fuel injection events small injected fuel masses to be delivered, the initial peak hold-in current may be sufficient for delivering a desired injected fuel mass without the need of a secondary holding current. Accordingly, the measured current profile line 502 depicting the unidirectionally applied current in the positive direction can be described with reference to the non-limiting exemplary plot 400 of FIG. 4.

Referring to plot 550, a first bi-directional current waveform for the first fuel injection event is depicted between times 0 and 5; a second bi-directional current waveform for the second fuel injection event is depicted between times 7 and 12; and the third bidirectional current waveform for a third fuel injection event is depicted between times 13 and 16. Each of the bi-directional current waveforms include a similar shape characterized by a duration and an initial peak pull-in current; however, the polarity of the measured current profile line 552 is alternating between each successive bi-directional current waveform, whereat the second bi-directional current waveform includes a corresponding polarity that is inversed to that of the corresponding polarity of the first and third bi-directional current waveforms.

The bi-directional current waveforms of plot 550 are substantially identical to the bi-directional current waveforms of plot 450 of FIG. 4 except that the bi-directional current waveforms of plot 550 do not include the secondary holding currents. Accordingly, the first bi-directional current waveform includes the peak pull-in current between times 1 and 2, the second bi-directional current waveform includes the negative peak pull-in current between times 8 and 9, and the third bi-directional current waveform includes the peak pull-in current at time 14 for a short duration. In response to an injector close command at time 2, the measured current profile line 552 of the first bi-directional current profile line is released to zero shortly after time 3 and the electrical current flow into the fuel injector is reversed in the negative direction until achieving a negative peak current between times 3 and 4.

Upon achieving the negative peak current between times 3 and 4, the magnitude of the reversed negative current flow is reduced (e.g., measured current profile line 552 is increased) to a small negative value at time 4. Thereafter, the measured current profile line 552 maintains the small negative value between times 4 and 5 to counter the presence of residual magnetic flux caused by the first fuel injection event due to the magnetic hysteresis. At time 5, the reversed negative current flow is released to zero for a period of time until a probing current is applied at time 6 prior to the injector open command at time 7 for the second fuel injection event. Accordingly, area 560 within plot 550 represents periods of reversed current flow in the negative direction to cancel out the effects of induced eddy currents from the first fuel injection event and counter the presence of residual magnetic flux caused by the first fuel injection event due to the magnetic hysteresis.

The second bi-directional current waveform is characterized by a similar duration and a similar shape to that of the first bi-directional current waveform; however, the second bi-directional current waveform includes an alternating polarity that is inversed from the polarity of the first bi-directional current waveform. In response to the injector open command at time 7, the measured current profile line 552 decreases to achieve the initial negative peak pull-in current at time 8 that is maintained for a short duration until time 9. In response to the injector close command at time 9, the measured current profile line 552 of the second bi-directional current waveform is released to zero after time 10 and the electrical current flow into the fuel injector is reversed in the positive direction until achieving a positive peak current before time 11. Here the positive peak current corresponds to the negative peak current between times 3 and 4 for the first fuel injection event, except that the positive peak current includes a polarity that is inversed. Applying the reversed positive current flow to achieve the positive peak current is effective to cancel out the effect of induced eddy currents in order to improve the magnetic force response acting upon the armature (e.g., armature portion 21) within the fuel injector. Upon achieving the positive peak current before time 11, the magnitude of the reversed positive current flow is reduced (e.g., measured current profile line 552 is decreased) to a small positive value at time 11. Thereafter, the measured current profile line 552 maintains the small positive value between times 11 and 12 to counter the presence of residual magnetic flux caused by the second fuel injection event due to the magnetic hysteresis. At time 12, the reversed positive current flow is released to zero for a period of time until a probing current is applied prior to the injector open command at time 13 for the third fuel injection event. The third bi-directional current waveform alternates to a polarity that is inversed from the second bi-directional current waveform. Therefore, the third bi-directional current waveform includes the same polarity as that of the first bi-directional current waveform. Accordingly, area 570 within plot 550 represents periods of reversed current flow in the positive direction to cancel out the effects of induced eddy currents from the second fuel injection event and counter the presence of residual magnetic flux caused by the second fuel injection event due to the magnetic hysteresis.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Method for providing consistent actuator events for each of a plurality of consecutive actuator events of an electromagnetic actuator, comprising:
applying a first bi-directional current waveform for a first actuator event, the first bi-directional current waveform applying current in a first direction when the actuator is commanded to an actuated position and applying current in a reversed second direction when the actuator is commanded to a rest position comprising applying current in the reversed second direction until a respective peak current effective to cancel out effects of induced eddy currents is achieved whereafter the current in the reversed second direction is reduced and maintained to a respective value effective to counter residual magnetic flux; and
applying a second bi-directional current waveform for an immediately subsequent second actuator event to the first actuator event, the second bi-directional current waveform applying current in the reversed second direction when the actuator is commanded to an actuated position and applying current in the first direction when the actuator is commanded to a rest position comprising applying current in the first direction until a respective peak current effective to cancel out effects of induced eddy currents is achieved whereafter the current in the first direction is reduced and maintained to a respective value effective to counter residual magnetic flux.

2. The method of claim 1, wherein the duration of the second bi-directional current waveform for the second actuator event is the same as the duration of the first bi-directional current waveform for the first actuator event.

3. The method of claim 1, wherein the amplitude of the second bi-directional current waveform for the second actuator event is of the same magnitude as the amplitude of the first bi-directional current waveform for the first actuator event, the amplitude of the second bi-directional current waveform having an inverse polarity relative to the first bi-directional current waveform.

4. The method of claim 1, wherein the shape of the second bi-directional current waveform for the second actuator event is adjusted from the shape of the first bi-directional current waveform for the first actuator event.

5. The method of claim 1, further comprising applying successive bi-directional current waveforms for each of the plurality of consecutive actuator events of the actuator, the successive bi-directional current waveforms having alternating polarities.

6. The method of claim 1, wherein applying current in a reversed second direction when the actuator is commanded to a rest position comprises applying current in a reversed second direction when the actuator is commanded to a rest position and the actuator is at the rest position.

7. The method of claim 1, wherein applying the first bi-directional current waveform for the first actuator event includes applying a secondary hold current in the first direction subsequent to applying current in the first direction when the actuator is commanded to the actuated position, the secondary hold current having a magnitude sufficient to maintain the actuator in the actuated position.

8. The method of claim 7, wherein the current in the reversed second direction when the actuator is commanded to the rest position is applied after the secondary hold current is released.

9. The method of claim 1, wherein applying the first bi-directional current waveform for the first actuator event and applying the second bi-directional current waveform for the second actuator event is utilized for closely-spaced consecutive actuations.

10. Method for providing consistent injected fuel masses for each of a plurality of consecutive fuel injection events of a fuel injector, comprising:
applying a first bi-directional current waveform for a first fuel injection event, the first bi-directional current waveform applying current in a first direction when the injector is commanded to open and applying current in a reversed second direction when the injector is commanded to close comprising applying current in the reversed second direction until a respective peak current effective to cancel out effects of induced eddy currents is achieved whereafter the current in the reversed second direction is reduced and maintained to a respective value effective to counter residual magnetic flux; and
applying a second bi-directional current waveform for an immediately subsequent second fuel injection event to the first fuel injection event, the second bi-directional current waveform applying current in the reversed second direction when the injector is commanded to open and applying current in the first direction when the injector is commanded to close comprising applying current in the first direction until a respective peak current effective to cancel out effects of induced eddy currents is achieved whereafter the current in the first direction is reduced and maintained to a respective value effective to counter residual magnetic flux.

11. The method of claim 10, wherein the duration of the second bi-directional current waveform for the second fuel injection event is the same as the duration of the first bi-directional current waveform for the first fuel injection event.

12. The method of claim 10, wherein the amplitude of the second bi-directional current waveform for the second fuel injection event is of the same magnitude as the amplitude of the first bi-directional current waveform for the first fuel injection event, the amplitude of the second bi-directional current waveform having an inverse polarity relative to the first bi-directional current waveform.

13. The method of claim 10, wherein the amplitude of the second bi-directional current waveform for the second fuel injection event is adaptively adjusted from the amplitude of the first bi-directional current waveform for the first fuel injection event.

14. The method of claim 10, further comprising applying successive bi-directional current waveforms for each of the plurality of consecutive fuel injection events of the fuel injector, the successive bi-directional current waveforms having alternating polarities.

15. The method of claim 10, wherein applying current in a reversed second direction when the fuel injector is commanded to a closed position comprises applying current in a reversed second direction when the fuel injector is commanded to a closed position and the fuel injector is at the closed position.

16. The method of claim 10, wherein applying the first bi-directional current waveform for the first fuel injection event includes applying a secondary hold current in the first direction subsequent to applying current in the first direction when the fuel injector is commanded to the open position, the secondary hold current having a magnitude sufficient to maintain the fuel injector in the open position.

17. The method of claim 10, wherein applying the first bi-directional current waveform for the first fuel injection event and applying the second bi-directional current waveform for the second fuel injection event is utilized for closely-spaced consecutive fuel injection events.

18. Apparatus for operation of a solenoid-activated fuel injector, comprising:
    an electromagnetic fuel injector, comprising:
        an electrical coil; and
        an armature portion;
    an injector driver configured to alternately:
        drive current into the electrical coil in a first direction to activate the fuel injector and subsequently drive current into the electrical coil in a reversed second direction to deactivate the fuel injector comprising applying current in the reversed second direction until a respective peak current effective to cancel out effects of induced eddy currents is achieved whereafter the current in the reversed second direction is reduced and maintained to a respective value effective to counter residual magnetic flux; and
        drive current into the electrical coil in the reversed second direction to activate the fuel injector and subsequently drive current into the electrical coil in the first direction to deactivate the fuel injector comprising applying current in the first direction until a respective peak current effective to cancel out effects of induced eddy currents is achieved whereafter the current in the first direction is reduced and maintained to a respective value effective to counter residual magnetic flux.

19. The apparatus of claim 18, wherein the injector driver comprises two switch sets configured to control a current flow between the injector driver and the electrical coil.

20. Method for providing consistent actuator events for each of a plurality of consecutive actuator events of an electromagnetic actuator, comprising:
    applying a first bi-directional current waveform for a first actuator event, the first bi-directional current waveform applying current in a first direction when the actuator is commanded to an actuated position and applying current in a reversed second direction when the actuator is commanded to a rest position; and
    applying a second bi-directional current waveform for an immediately subsequent second actuator event to the first actuator event, the second bi-directional current waveform applying current in the reversed second direction when the actuator is commanded to an actuated position and applying current in the first direction when the actuator is commanded to a rest position;
    wherein the shape of the second bi-directional current waveform for the second actuator event is adjusted from the shape of the first bi-directional current waveform for the first actuator event.

* * * * *